US 6,657,453 B2

(12) United States Patent
Frankowsky

(10) Patent No.: US 6,657,453 B2
(45) Date of Patent: Dec. 2, 2003

(54) SEMICONDUCTOR WAFER TESTING SYSTEM AND METHOD

(75) Inventor: Gerd Frankowsky, Höhenkirchen-Siegertsbrunn (DE)

(73) Assignee: Infineon Technologies AG (DE)

( * ) Notice: Subject to any disclaimer, the term of this patent is extended or adjusted under 35 U.S.C. 154(b) by 61 days.

(21) Appl. No.: 10/098,273

(22) Filed: Mar. 15, 2002

(65) Prior Publication Data

US 2003/0173987 A1 Sep. 18, 2003

(51) Int. Cl.[7] .............................................. G01R 31/26
(52) U.S. Cl. ........................................ 324/765; 324/750
(58) Field of Search .............................. 324/158.1, 764, 324/765, 759, 755, 750, 763, 523, 527, 528; 365/201; 702/118, 120; 438/14; 156/378; 257/48

(56) References Cited

U.S. PATENT DOCUMENTS 6,407,944 B1 * 6/2002 Choi et al. .............. 365/185.09

6,563,335 B2 * 5/2003 Seki ........................... 326/16

* cited by examiner

Primary Examiner—Kamand Cuneo
Assistant Examiner—Trung Nguyen
(74) Attorney, Agent, or Firm—Lerner, David, Littenberg, Krumholz & Mentlik, LLP

(57) ABSTRACT

An apparatus for testing a plurality of semiconductor devices of a common wafer includes a plurality of driver circuits, each operable to produce an intermediate test signal as a function of a source test signal; a plurality of sets of isolation components, each isolation component of a given set (i) receiving the intermediate test signal from one of the driver circuits associated with the set, and (ii) producing a wafer level test signal such that each wafer level test signal is at least partially electrically isolated from one another; and a plurality of wafer contactors, each coupled to a respective one of the isolation components and operable to electrically connect to one of the semiconductor devices and to conduct a respective one of the wafer level test signals to that semiconductor device, wherein the wafer contactors are coupled to the isolation components such that adjacent semiconductor devices of the wafer receive wafer level test signals from different sets of isolation components.

15 Claims, 5 Drawing Sheets

SEMICONDUCTOR WAFER TESTING SYSTEM AND METHOD

BACKGROUND OF THE INVENTION

The present invention relates to an apparatus and method for testing a plurality of semiconductor devices of a common wafer and, more particularly, to an apparatus and method that permits large scale parallel testing of the semiconductor devices despite the potential for large clusters of defects in the wafer.

It is desirable to conduct quality assurance tests on semiconductor devices of a common wafer prior to their removal from the wafer. Indeed, knowledge that a particular semiconductor device of the wafer is defective avoids the costs associated with careful removal and packaging of the defective semiconductor device.

FIG. 1 illustrates a known technique for testing a semiconductor device 12 while it remains integral with the wafer 10. The wafer 10 includes a plurality of semiconductor devices 12, it being understood that an actual wafer may include any number of semiconductor devices 12, a typical number being about 500. An apparatus 20 for testing the semiconductor device 12 may include a test signal generator 22, a driver 24, and a signal sense circuit 26. The test signal generator 22 produces a test signal that may be modified by the driver 24. For example, the driver 24 may amplify the test signal to produce an amplified test signal having one or both of a larger voltage amplitude or current capability as compared to the test signal. Often, the driver 24 simply provides a source of current that is greater than the test signal generator 22 could provide alone.

The amplified test signal produced by the driver 24 is delivered to the semiconductor device 12 by way of a wafer level contactor 30A that may automatically engage with and disengage from portions of the semiconductor device 12. More particularly, the semiconductor device 12 may include an electronic circuit portion 14A and a plurality of terminals (or pads) 16A, 16B, etc. The terminals 16 provide input/output connections to various nodes of the electronic circuit portion 14A. (Later in the manufacturing process, the terminals 16 are utilized to connect the electronic circuit portion 14 to external leads of the semiconductor package.) The wafer level contactor 30A engages with terminal 16A such that the amplified test signal from the driver 24 may be delivered to the electronic circuit portion 14 and quality assurance tests may be performed.

A given quality assurance test may require that more than one wafer level contactor 30 engage the semiconductor device 12. Two wafer level contactors (or probes) 30A and 30B are shown for purposes of discussion. The signal sense circuit 26 functions to monitor the voltage and/or current of the one or more signals provided to the semiconductor device 12 during the quality assurance test to determine whether the semiconductor device 12 is defective.

By way of example, the quality assurance test may be a short circuit test to determine whether a given terminal, such as terminal 16A of the semiconductor device 12 is shorted to another of the terminals, such as terminal 16B of the semiconductor device 12. This test may be utilized to determine whether a particular input terminal 16 is shorted to VSS or VDD of the electronic circuit portion 14. When the test signal generator 22 causes the voltage potential of the amplified test signal to substantially rise above the voltage potential at terminal 16B, significant current flow from the driver 24 through the wafer level contactor 30A would indicate a short circuit between terminal 16A and terminal 16B. The signal sense circuit 26 may measure the current by way of a current transformer or a voltage drop across a series coupled resistor R.

It is desirable to perform the quality assurance tests on substantially all of the semiconductor devices 12 of the wafer 10 concurrently (i.e., in parallel) in order to increase the efficiency of the quality assurance testing procedure. With reference to FIG. 2, all of the semiconductor devices 12 (only four semiconductor devices 12A–D being shown for simplicity) may be tested in parallel utilizing apparatus 50. The apparatus 50 includes the test signal generator 22, the driver 24, and the signal sense circuit 26 of FIG. 1, but also includes a plurality of isolation resistors 52 associated with the driver 24. The isolation resistors 52 produce respective signals on a plurality of wafer level contactors 30A–D, which engage respective terminals 16 (not shown) of the semiconductor devices 12A–D.

The isolation resistors 52 mitigate against a defect in one of the semiconductor devices 12 from upsetting the quality assurance test of another of the semiconductor devices 12. For example, when short circuit testing is performed, a short circuit existing in semiconductor 12A may tend to draw significant current from the driver 24. The current would flow through one of the isolation resistors (e.g., resistor 54), through the short circuit of the semiconductor device 12A, and into ground (assuming that the driver 12 produced an amplified test signal having a voltage potential higher than ground). The short circuit current would cause a voltage drop across the isolation resistor 54. This voltage drop may be measured by the signal sense circuit 26 in order to detect that the semiconductor device 12A is defective (i.e., includes a short circuit).

Ideally, the short circuit on semiconductor device 12A (and resultant increased current from the driver 24 through isolation resistor 54) would not deleteriously affect the quality assurance tests concurrently being performed on semiconductor devices 12B–D. In other words, the quality of the test signal being delivered to semiconductor devices 12B–D via wafer level contactors 30B–30D would ideally not be affected by the defect on semiconductor device 12A. In a practical circuit, however, the increased current drawn from the driver 24 through isolation resistor 54 due to the short circuit on semiconductor device 12A will affect the quality of the test signals being delivered to the other semiconductor devices 12B–D, although the affect is often negligible when only a few of the plurality of semiconductor devices 12 includes a defect. The conventional apparatus 50, however, may employ one driver 24 to service over one hundred semiconductor devices 12 by employing a corresponding number of isolation resistors 52. A larger number of defective semiconductor devices 12 could draw excessive current from the driver 24, thereby causing excessive degradation of the test signals being delivered to the other semiconductor devices 12.

With reference to FIG. 3, a first driver 24A may service all of the semiconductor devices 12 in a first zone 60 of the wafer 10. A first set of isolation resistors 52A may be utilized to isolate the test signals delivered to the respective semiconductor devices 12 of the first zone 60. Similarly, a second driver 24B may service all of the semiconductor devices 12 in a second zone 62 by way of a second set of isolation resistors 52B. Third and fourth drivers may service the semiconductor devices of other zones, although they are not shown for purposes of simplicity.

When only a relatively small number of defective devices 12 exist in the first zone 60 of the wafer 10, the driver 24A may have a sufficiently high current rating to source the current required to flow through the associated isolation resistors 52A and defective semiconductor devices 12 to maintain the quality of the test signals provided to the other semiconductor devices (non-defective semiconductor devices) in the first zone 60. When a significant number of semiconductor devices 12 are defective, however, such as would be the case in a large cluster of defects 70, the driver 24A might not be capable of delivering sufficient current through the associated isolation resistors 52A to maintain the integrity of the other test signals for non-defective semiconductor devices 12. For example the test signal produced by the driver 24 may droop excessively. Unfortunately, when this happens, the signal sense circuit 26 may not be capable of discerning between non-defective and defective semiconductor devices 12 and, therefore, every one of the semiconductor devices 12 might be assumed to be defective. This leads to a disadvantageous reduction in yield through the quality assurance test process.

Although the number of drivers 24 could be increased such that the number of semiconductor devices 12 within a given zone may be decreased, the resulting increase in test equipment cost, maintenance, power draw, etc. might not be practicable or desirable.

Accordingly, there is a need in the art for a new apparatus and method of testing the semiconductor devices of a common wafer that is substantially immune to the false test failures caused by large clusters of defective semiconductor devices within a given zone of the wafer.

SUMMARY OF THE INVENTION

In accordance with one or more aspects of the present invention, an apparatus for testing a plurality of semiconductor devices of a common wafer includes a plurality of driver circuits, each operable to produce an intermediate test signal as a function of a source test signal; a plurality of sets of isolation components, each isolation component of a given set (i) receiving the intermediate test signal from one of the driver circuits associated with the set, and (ii) producing a wafer level test signal such that each wafer level test signal is at least partially electrically isolated from one another; and a plurality of wafer contactors, each coupled to a respective one of the isolation components and operable to electrically connect to one of the semiconductor devices and to conduct a respective one of the wafer level test signals to that semiconductor device.

The wafer contactors are preferably coupled to the isolation components such that adjacent semiconductor devices of the wafer receive wafer level test signals from different sets of isolation components. The wafer contactors may be coupled to the isolation components such that wafer level test signals from a given set of isolation components are distributed to semiconductor devices that are located substantially homogeneously over the wafer.

The isolation components preferably include resistors. For example, each isolation component of a given one of the sets may include a resistor coupled in series between the associated driver circuit and one of the wafer contactors.

The apparatus may further include at least one signal sensing circuit operable to monitor at least one of (i) voltage potentials of one or more of the wafer level test signals; and (ii) currents through one or more of the isolation components. For example, the apparatus may be operable to perform short circuit tests on the semiconductor devices. In this case the at least one signal sensing circuit is operable to monitor the voltage potentials of the wafer level test signals from at least one of the sets of resistors; and a given one of the semiconductor devices fails the short circuit test when a magnitude of at least one of the wafer level signals delivered to it falls below a predetermined threshold. Each instance in which one of the wafer level signals from one of the sets of resistors falls below the predetermined threshold indicates a corresponding increase in current drawn from the driver circuit associated with that set of resistors. A cluster of defective semiconductor devices of the wafer causes respective substantially similar increases in current drawn from each of the driver circuits.

In accordance with at least one further aspect of the invention, a method of testing a plurality of semiconductor devices on a common semiconductor wafer includes producing respective intermediate test signals as functions of at least one source test signal using a plurality of respective driver circuits; producing respective sets of wafer level test signals from each of the intermediate test signals using respective sets of isolation components such that each wafer level test signal of a set is at least partially electrically isolated from one another; and conducting the respective wafer level test signals to the semiconductor devices using respective wafer contactors such that adjacent semiconductor devices of the wafer receive wafer level test signals from different sets of isolation components.

The method may further include sensing at least one of (i) voltage potentials of one or more of the wafer level test signals; and (ii) currents through one or more of the isolation components. For example, a given one of the semiconductor devices may fail a short circuit test when a magnitude of at least one of the wafer level signals delivered to it falls below a predetermined threshold.

Other objects, features, and advantages will be apparent to one skilled in the art in view of the disclosure herein when taken in conjunction with the accompanying drawings.

BRIEF DESCRIPTION OF THE DRAWINGS

For the purposes of illustrating the invention, there are shown in the drawings forms which are presently preferred, it being understood, however, that the invention is not limited by the precise arrangements and instrumentalities shown.

DETAILED DESCRIPTION

Figure 1:
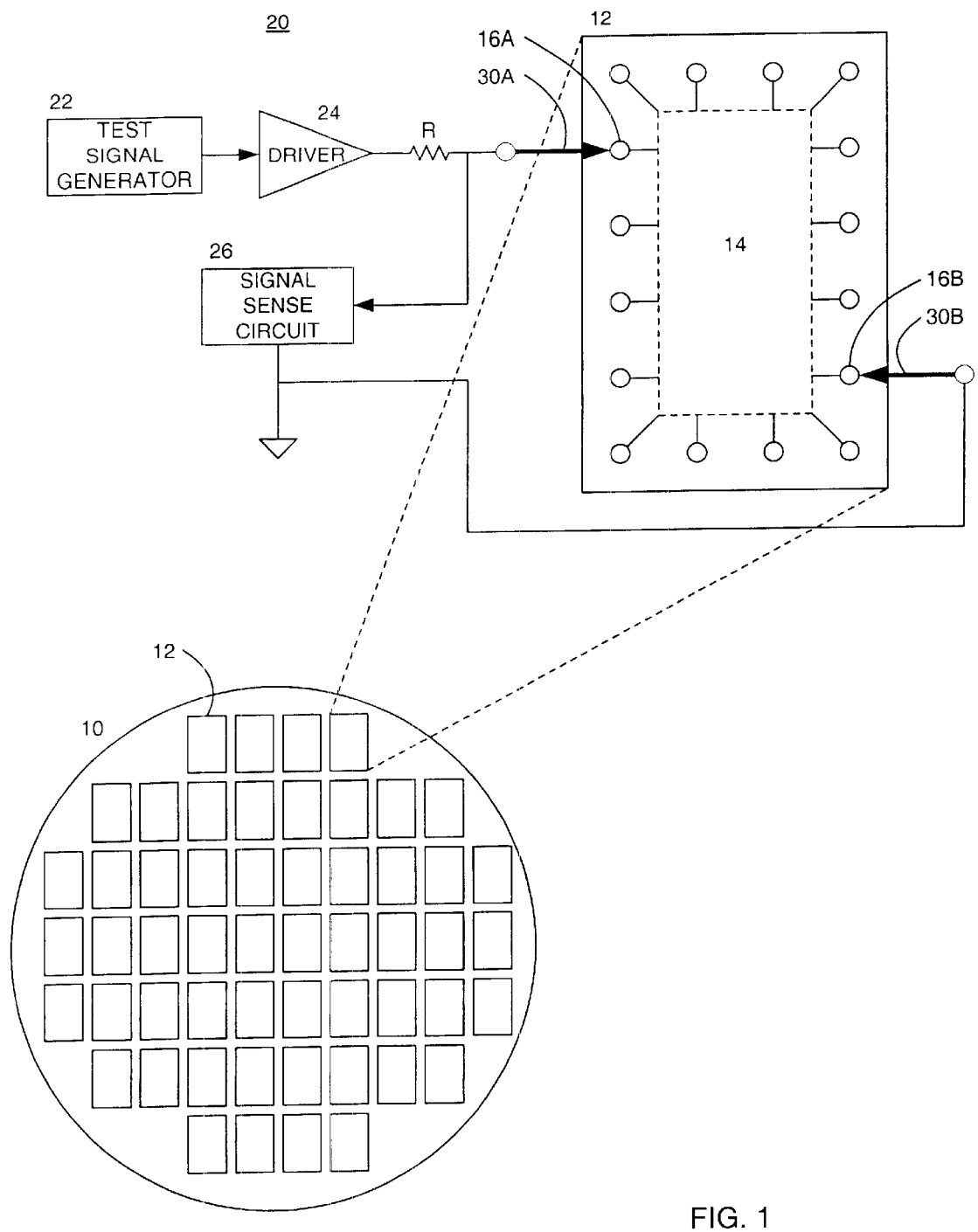
FIG. 1 is a block diagram illustrating a convention apparatus for testing a semiconductor device of a wafer.
Figure 2:
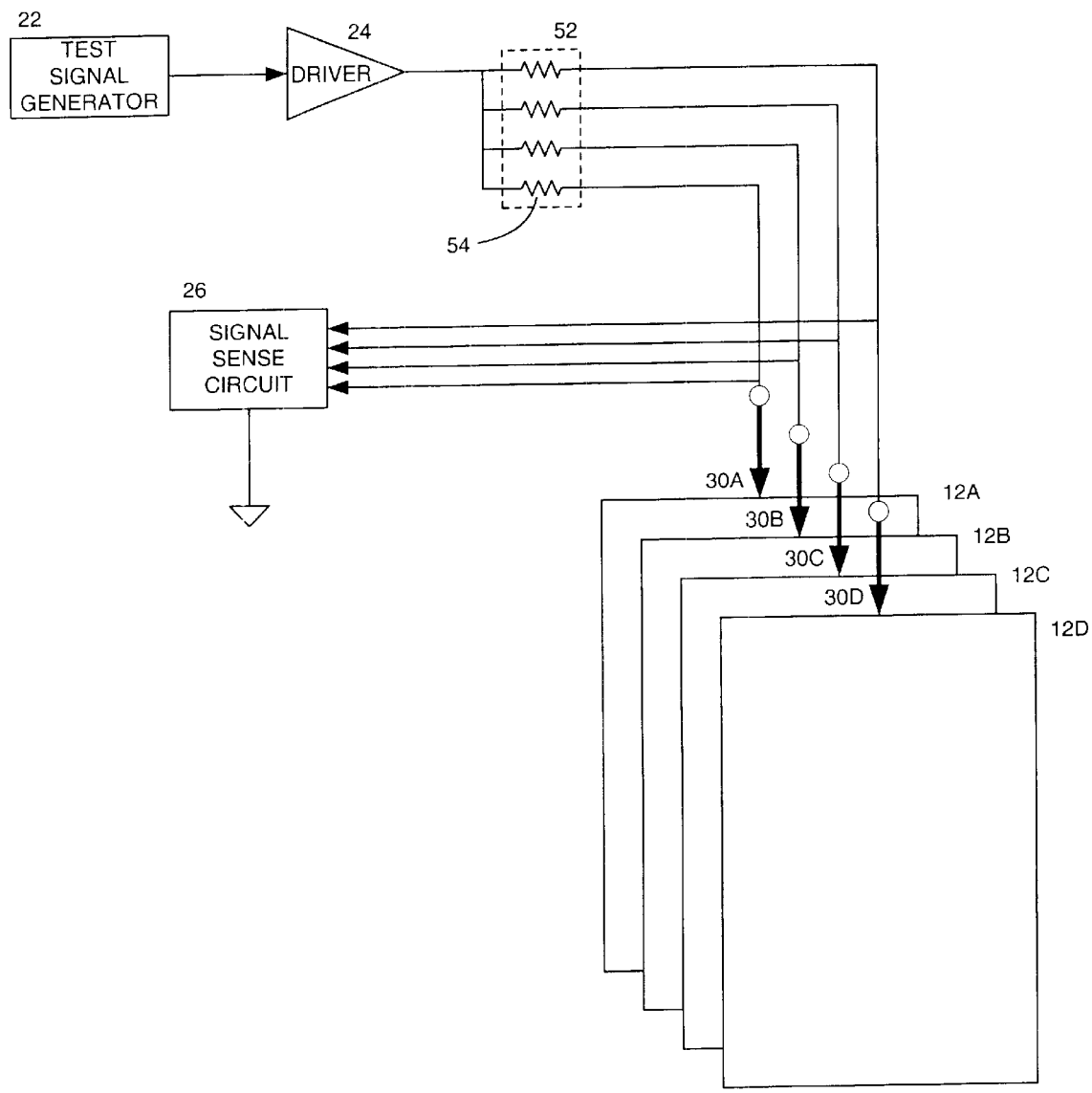
FIG. 2 is a block diagram illustrating an apparatus for concurrently testing a plurality of semiconductor devices of a wafer.
Figure 3:
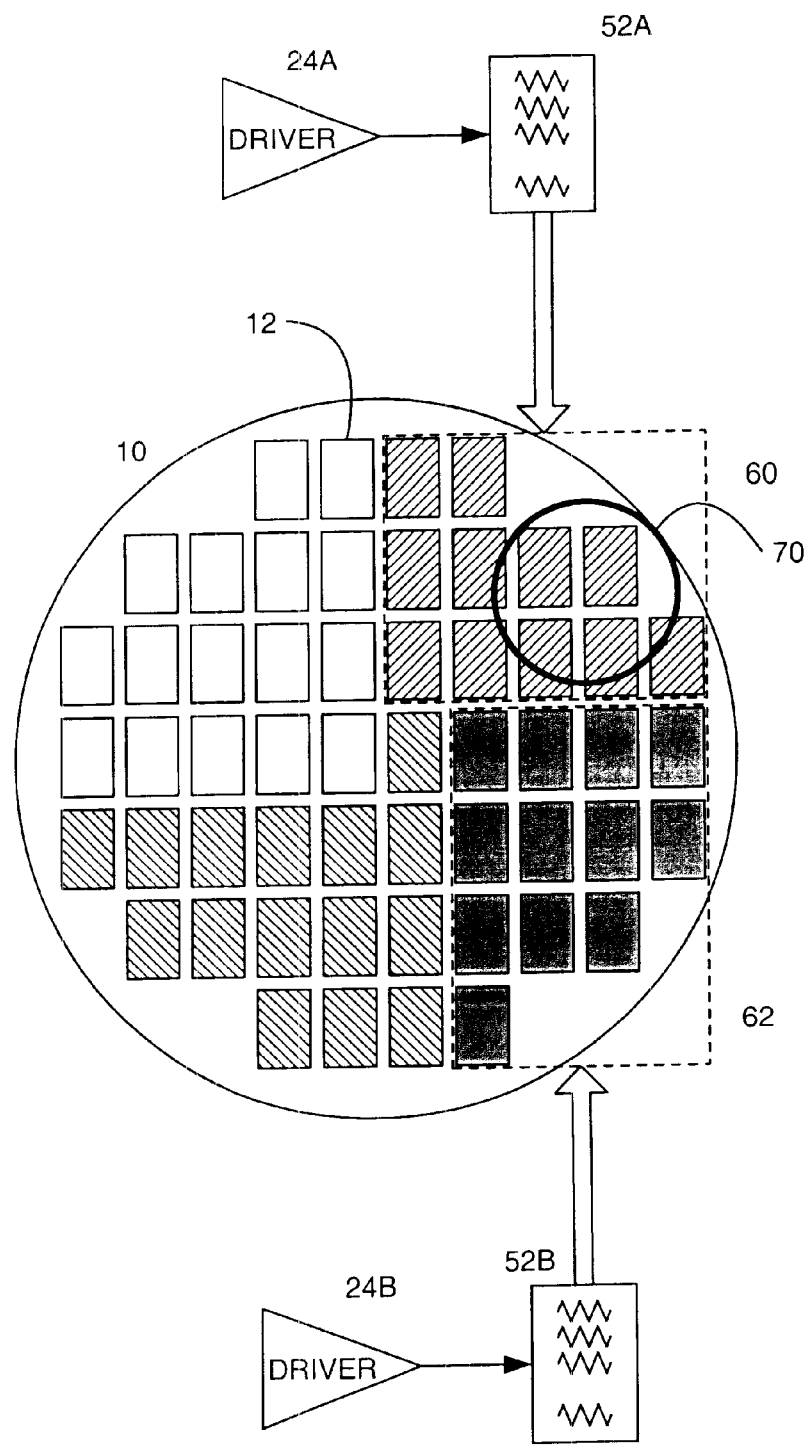
FIG. 3 is a schematic diagram providing further details of the apparatus of FIG. 2.
Figure 4:
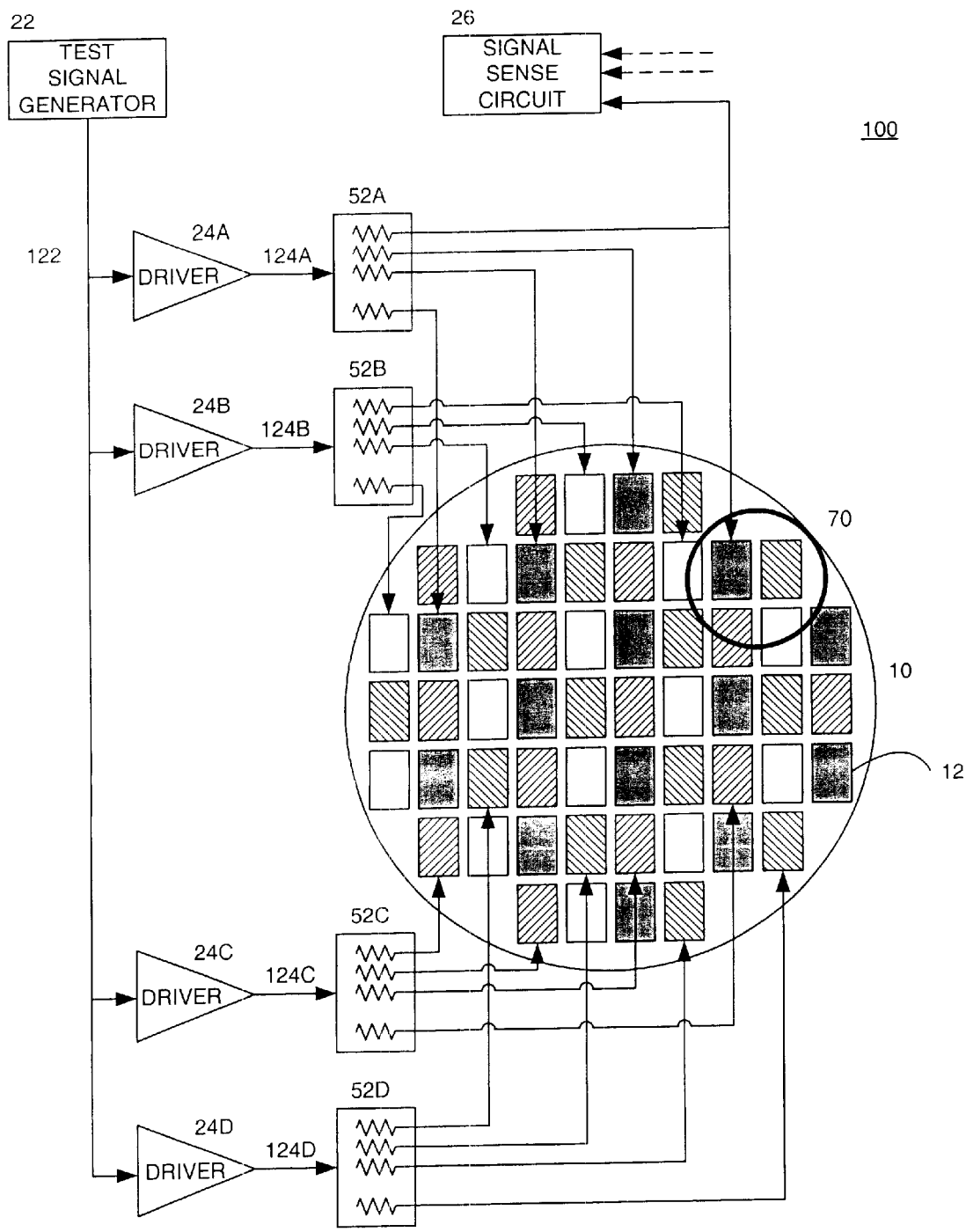
FIG. 4 is a schematic diagram of an apparatus for concurrently testing a plurality of semiconductor devices on a common wafer in accordance with one or more aspects of the present invention.

Referring now to the drawings wherein like numerals indicate like elements, there is shown in FIG. 4 an apparatus 100 for concurrently testing a plurality of semiconductor devices 12 on a common wafer 10. The apparatus 100 includes a test signal generator 22, a plurality of driver circuits 24 (four such driver circuits 24A–D being shown by way of example), and a plurality of sets of isolation components 52A–D. The test signal generator 22 produces a source test signal on line 122 that is utilized by each of the driver circuits 24A–D to produce respective intermediate test signals on lines 124A–D, respectively. Each set of isolation components 52A–D includes a plurality of isolation components, such as resistors or any of the other known devices suitable for providing isolation. Each isolation component of a given set 52A–D is preferably operable to receive the intermediate test signal from the driver circuit 24 associated with the set 52A–D and to produce a wafer level test signal that is at least partially electrically isolated from other wafer level test signals produced by others of the isolation components of the set 52A–D.

A plurality of wafer contactors 30 (schematically illustrated by way of arrows), substantially similar to the wafer contactors 30 discussed hereinabove, are coupled to the respective isolation components of each set 52A–D. The wafer contactors 30 are operable to electrically connect to one of the semiconductor devices 12 and to conduct a respective one of the wafer level test signals to that semiconductor device. The wafer contactors 30 are preferably coupled to the isolation components such that adjacent semiconductor devices 12 of the wafer 10 receive wafer level test signals from different sets of isolation components 52A–D. In other words, the wafer contactors 30 are distributed over the wafer 10 with respect to the respective semiconductor devices 12 such that adjacent semiconductor devices 12 receive wafer level test signals derived from different drivers 24. Preferably, the wafer contactors 30 are coupled to the isolation components such that adjacent wafer level test signals from a given set of isolation components 152A–D are distributed to semiconductor devices 12 that are located substantially homogeneously over the wafer 10.

Advantageously, the apparatus 100 in accordance with the invention distributes the current burden caused by a cluster of defects 70 on the wafer 10 to a substantial number of the drivers 24A–D in a way that significantly reduces the likelihood that the current ratings of the respective drivers 24A–D would be exceeded. Indeed, a given set of isolation components 52A are coupled to semiconductor devices 12 disposed throughout the wafer 10 as opposed to within a given zone and, therefore, the cluster of defects 70 is unlikely to draw significantly more current from one of the drivers 24A–D than another. This is so even though the current rating of a given driver circuit 24A–D might be exceeded when only a subset of the isolation components of a given set 52A–D are shorted to a ground potential of that driver circuit.

The apparatus 100 also preferably includes at least one signal sensing circuit 26 operable to monitor one or both of (i) the voltage potentials of one or more of the wafer level test signals; and (ii) the currents through one or more of the isolation components such that defects in the semiconductor devices 12 may be detected. For example, short circuit tests may be performed on the semiconductor devices 12 by monitoring the voltage potentials of the wafer level test signals, where a given one of the semiconductor devices 12 would fail the short circuit test when a magnitude of at least one of the wafer level test signals falls below a predetermined threshold.

Figure 5:
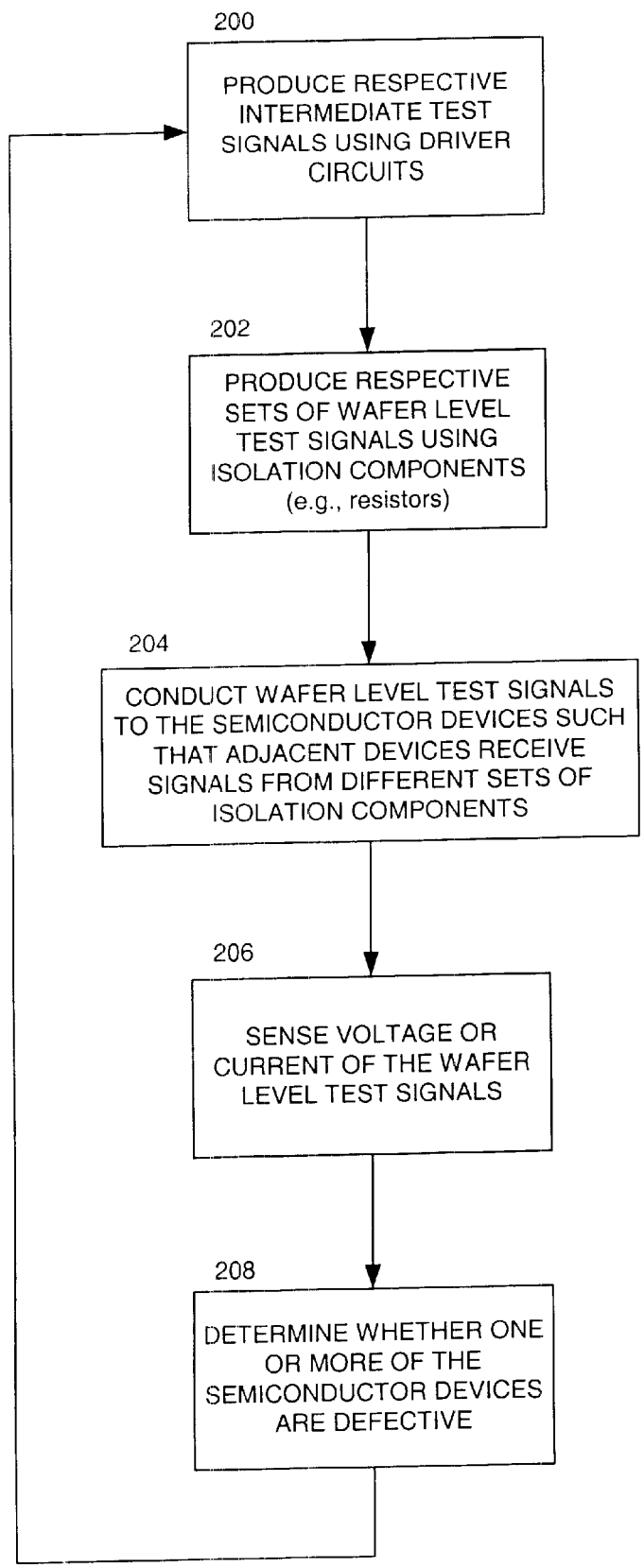
FIG. 5 is a flow diagram illustrating actions that may be carried out in accordance with one or more further aspects of the present invention.

With reference to FIG. 5, a method of testing a plurality of semiconductor devices 12 in accordance with one or more aspects of the invention is illustrated by way of a flow diagram. In accordance with the method, respective intermediate test signals are produced as functions of at least one source test signal using a plurality of respective driver circuits (action 200). At action 202, respective sets of wafer level test signals are produced from each of the intermediate test signals using respective sets of isolation components. Each wafer level test signal of a set is at least partially electrically isolated from one another. The respective wafer level test signals are conducted to the semiconductor devices using respective wafer contactors such that adjacent semiconductor devices of the wafer receive wafer level test signals from different sets of isolation components (action 204). At action 206, at least one of (i) voltage potentials of one or more of the wafer level test signals; and (ii) currents through one or more of the isolation components are sensed in order to detect defects in the semiconductor devices (action 206). When a given test is a short circuit test, a semiconductor device is determined defective when a magnitude of at least one of the wafer level test signals delivered to it falls below a predetermined threshold (action 208).

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. An apparatus for testing a plurality of semiconductor devices of a common wafer, comprising:

a plurality of driver circuits, each operable to produce an intermediate test signal as a function of a source test signal;

a plurality of sets of isolation components, each isolation component of a given set (i) receiving the intermediate test signal from one of the driver circuits associated with the set, and (ii) producing a wafer level test signal such that each wafer level test signal is at least partially electrically isolated from one another; and a plurality of wafer contactors, each coupled to a respective one of the isolation components and operable to electrically connect to one of the semiconductor devices and to conduct a respective one of the wafer level test signals to that semiconductor device, wherein the wafer contactors are coupled to the isolation components such that adjacent semiconductor devices of the wafer receive wafer level test signals from different sets of isolation components.

2. The apparatus of claim 1, wherein the wafer contactors are coupled to the isolation components such that wafer level test signals from a given set of isolation components are distributed to semiconductor devices that are located substantially homogeneously over the wafer.

3. The apparatus of claim 2, wherein a cluster of defective semiconductor devices of the wafer causes respective substantially similar decreases in signal integrity of the respective intermediate test signals.

4. The apparatus of claim 1, wherein the isolation components include resistors.

5. The apparatus of claim 4, wherein each isolation component of a given one of the sets includes a resistor coupled in series between the associated driver circuit and one of the wafer contactors.

6. The apparatus of claim 5, wherein a current rating of at least one of the driver circuits would be exceeded when a subset of the wafer contactors are shorted to a ground potential of that driver circuit.

7. The apparatus of claim 5, further comprising at least one signal sensing circuit operable to monitor at least one of (i) voltage potentials of one or more of the wafer level test signals; and (ii) currents through one or more of the isolation components.

8. The apparatus of claim 7, wherein:

the apparatus is operable to perform short circuit tests on the semiconductor devices;

the at least one signal sensing circuit is operable to monitor the voltage potentials of the wafer level test signals from at least one of the sets of resistors; and a given one of the semiconductor devices fails the short circuit test when a magnitude of at least one of the wafer level signals delivered to it falls below a predetermined threshold.

9. The apparatus of claim 8, wherein:

each instance in which one of the wafer level signals from one of the sets of resistors falls below the predetermined threshold indicates a corresponding increase in current drawn from the driver circuit associated with that set of resistors; and a cluster of defective semiconductor devices of the wafer causes respective substantially similar increases in current drawn from each of the driver circuits.

10. The apparatus of claim 9, wherein a current rating of at least one of the driver circuits would be exceeded when a subset of the wafer contactors are shorted to a ground potential of that driver circuit.

11. An apparatus for testing a plurality of semiconductor devices of a common wafer, comprising:

a plurality of driver circuits, each operable to produce an intermediate test signal as a function of a source test signal;

a plurality of sets of isolation components, each isolation component of a given set (i) receiving the intermediate test signal from one of the driver circuits associated with the set, and (ii) producing a wafer level test signal such that each wafer level test signal is at least partially electrically isolated from one another; and a plurality of wafer contactors, each coupled to a respective one of the isolation components and operable to electrically connect to one of the semiconductor devices and to conduct a respective one of the wafer level test signals to that semiconductor device, wherein the wafer contactors are located with respect to the respective semiconductor devices of the wafer such that adjacent semiconductor devices receive wafer level test signals from different sets of isolation components.

12. A method of testing a plurality of semiconductor devices on a common semiconductor wafer, comprising:

producing respective intermediate test signals as functions of at least one source test signal using a plurality of respective driver circuits;

producing respective sets of wafer level test signals from each of the intermediate test signals using respective sets of isolation components such that each wafer level test signal of a set is at least partially electrically isolated from one another; and conducting the respective wafer level test signals to the semiconductor devices using respective wafer contactors such that adjacent semiconductor devices of the wafer receive wafer level test signals from different sets of isolation components.

13. The method of claim 12, wherein each isolation component of a given one of the sets includes a resistor coupled in series between the associated driver circuit and one of the wafer contactors.

14. The method of claim 13, further comprising sensing at least one of (i) voltage potentials of one or more of the wafer level test signals; and (ii) currents through one or more of the isolation components.

15. The method of claim 14, wherein a given one of the semiconductor devices fails a short circuit test when a magnitude of at least one of the wafer level signals delivered to it falls below a predetermined threshold.

* * * * *